(12) United States Patent
Chen et al.

(10) Patent No.: US 10,312,432 B2
(45) Date of Patent: Jun. 4, 2019

(54) MAGNETIC MEMORY DEVICE AND TECHNIQUES FOR FORMING

(71) Applicant: Varian Semiconductor Equipment Associates, Inc., Gloucester, MA (US)

(72) Inventors: Tsung-Liang Chen, Hamilton, MA (US); Shurong Liang, Poughkeepsie, NY (US); Alexander C. Kontos, Beverly, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/091,846

(22) Filed: Apr. 6, 2016

(65) Prior Publication Data

US 2017/0294569 A1 Oct. 12, 2017

(51) Int. Cl.
*H01L 43/02* (2006.01)
*H01L 43/12* (2006.01)
*H01L 43/08* (2006.01)

(52) U.S. Cl.
CPC .............. *H01L 43/02* (2013.01); *H01L 43/08* (2013.01); *H01L 43/12* (2013.01)

(58) Field of Classification Search
CPC .......... H01L 43/02; H01L 43/12; H01L 43/10
See application file for complete search history.

(56) References Cited

U.S. PATENT DOCUMENTS

| | | | |
|---|---|---|---|
| 2003/0011017 A1 | 1/2003 | Lee et al. | |
| 2009/0065841 A1 | 3/2009 | Shappir et al. | |
| 2009/0075490 A1* | 3/2009 | Dussarrat | H01L 21/02164 438/787 |
| 2012/0261767 A1 | 10/2012 | Church | |
| 2014/0087483 A1* | 3/2014 | Ohsawa | H01J 37/08 438/3 |
| 2014/0273597 A1 | 9/2014 | Nguyen et al. | |
| 2014/0329390 A1* | 11/2014 | Inoue | H01J 37/32192 438/711 |
| 2014/0356549 A1 | 12/2014 | Varadarajan | |
| 2015/0243883 A1* | 8/2015 | Swaminathan | H01L 43/12 438/761 |

FOREIGN PATENT DOCUMENTS

WO WO2009014527 A1 1/2009

OTHER PUBLICATIONS

International Search Report and Written Opinion dated Jul. 11, 2017 for PCT/US2017/025265 filed Mar. 31, 2017.

\* cited by examiner

*Primary Examiner* — Bilkis Jahan
*Assistant Examiner* — Victor V Barzykin

(57) ABSTRACT

A method may include: providing a device stack, the device stack comprising sidewall portions and extending above a substrate base, the device stack further including a plurality of metal layers; depositing an interface layer conformally over the device stack using an atomic layer deposition process, the interface layer comprising a first insulator material; depositing an encapsulation layer on the interface layer, the encapsulation layer comprising a second insulator material; and depositing an interlevel dielectric disposed on the encapsulation layer, the interlevel dielectric comprising a third insulator material.

13 Claims, 3 Drawing Sheets

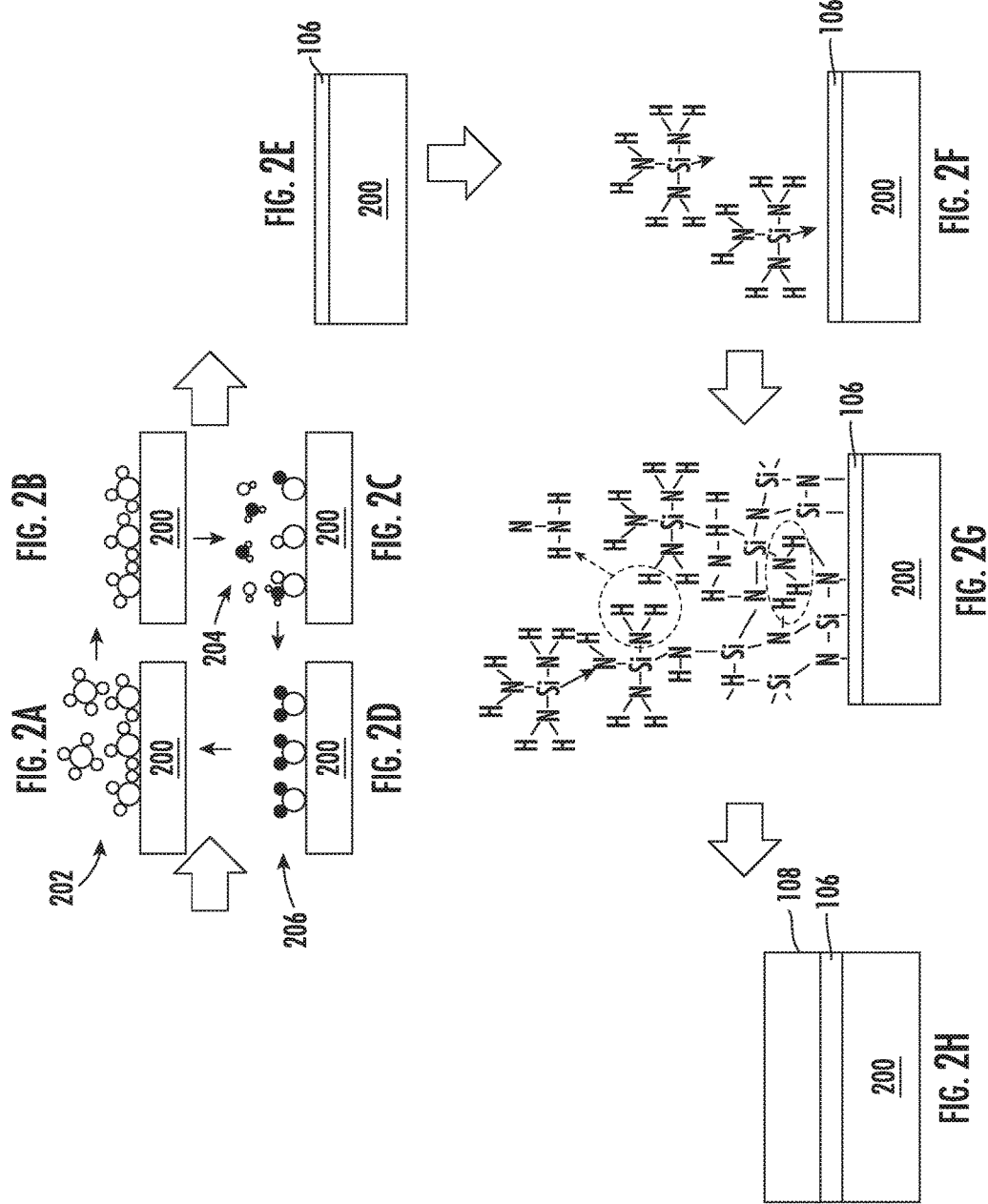

US 10,312,432 B2

MAGNETIC MEMORY DEVICE AND TECHNIQUES FOR FORMING

FIELD

The present embodiments relate to magnetic memory devices, electronic device and more particularly, device structure and techniques for forming improved magnetic memory devices.

BACKGROUND

One class of magnetic memory devices receiving increased attention in the recent period is the so-called magnetic tunnel junction (MTJ) devices. These devices may include multiple magnetic layers, such as metal layers, as well as insulating layers. During fabrication, an interlevel dielectric (ILD) layer may be used to provide electrical isolation (insulation) between MTJ devices or between MTJ device and other conductive layers. In addition, a protection layer may be used as a barrier between the ILD material and an MTJ device. The protection layer may encapsulate an MTJ device and may prevent degradation of the magnetic properties of an MTJ device caused by diffusion of moisture from the ILD material. During high temperature processing subsequent to forming an MTJ device stack, the protection layer may also prevent the out-diffusion of metal materials used in the MTJ device.

Silicon nitride (SiN) films have been widely used as a protection layer, in part because the silicon nitride may act as a diffusion barrier in preventing oxidation of an MTJ device stack. A plasma enhanced chemical vapor deposition process (or, simply, plasma enhanced chemical vapor deposition), sometimes referred to as PECVD is the most commonly used technique for forming an encapsulating SiN film, where a combination of silane ($SiH_4$) and ammonia ($NH_3$) may be employed. This may result in adequate film quality and conformality over the MTJ device being coated. One side effect of the SiN film deposition process is the degradation of magnetic anisotropy of an MTJ device, such as when a CoFeB alloy layer is used in the MTJ device. In particular metal interfaces may be damaged during encapsulation due to a number of factors, including reactive radical reaction, high reactivity of radicals due to elevated temperatures employed in the PECVD process, as well as high energy ions or other species impinging on the MTJ device. With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method may include providing a device stack, the device stack comprising sidewall portions and extending above a substrate base, the device stack further including a plurality of metal layers; depositing an interface layer conformally over the device stack using an atomic layer deposition process, the interface layer comprising a first insulator material; depositing an encapsulation layer on the interface layer, the encapsulation layer comprising a second insulator material; and depositing an inter- level dielectric disposed on the encapsulation layer, the interlevel dielectric comprising a third insulator material.

In another embodiment, a magnetic device, comprising: a device stack, the device stack comprising sidewall portions and extending above a substrate base, the device stack including a plurality of magnetic layers and at least one insulator layer; an interface layer disposed on the sidewall portions of the device stack and comprising an insulator material; an encapsulation layer disposed on the interface layer, the encapsulation layer comprising silicon nitride; and an interlevel dielectric disposed on the encapsulation layer, the interlevel dielectric comprising an insulating material.

In another embodiment, a method of forming a magnetic device may include providing a device stack, the device stack comprising sidewall portions and extending above a substrate base, the device stack further including a plurality of magnetic layers; depositing an interface layer conformally over the device stack using an atomic layer deposition process, the interface layer comprising an insulator material having a thickness of one nanometer to three nanometers; depositing an encapsulation layer on the interface layer, the encapsulation layer comprising silicon nitride; and depositing an interlevel dielectric disposed on the encapsulation layer, the interlevel dielectric comprising an insulating material.

BRIEF DESCRIPTION OF THE DRAWINGS

FIGS. 2A-2H illustrate various operations involved in a technique for forming a magnetic device in accordance with various embodiments of the disclosure.

DETAILED DESCRIPTION

Figure 1A:
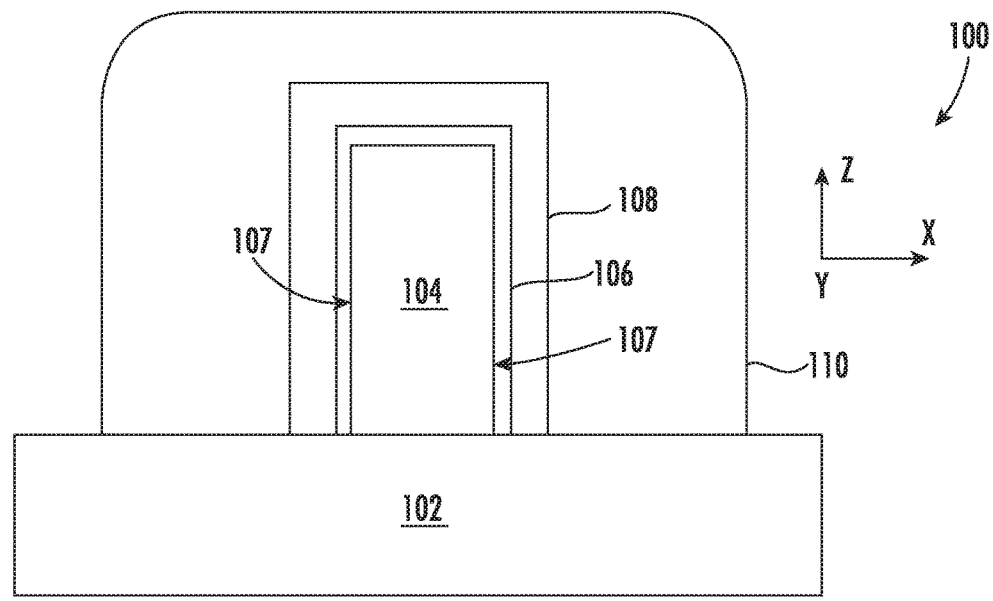
FIGS. 1A and 1B depict aspects of a device according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and structures to form improved device structures, and in particular to form improved magnetic memory devices. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, metal layer, and so forth.

Various embodiments provide improved memory devices such as a magnetic random access memory (MRAM), and in particular improved magnetic tunnel junction (MTJ) devices or related memory devices. Embodiments may provide special preparation techniques for treating and protecting a device stack after the device stack is patterned to form a device structure. The device stack may include a plurality of different layers including a plurality of metal layers such as magnetic layers to form a MTJ device. As detailed below, various embodiments provide a thin interface layer activing to prevent undesirable effects often occurring during processing of MTJ devices or similar devices. These undesirable effects include nitridation or other type of damage to a given metal layer occurring when a device structure formed into a patterned device stack is exposed to a high energy plasma to form an encapsulation layer around the device structure.

In accordance with various embodiments disclosed below, a process employing self-activated surface chemistry may be employed for forming an interface layer having good conformality for covering a patterned device stack. The reaction chemistry in such a process may be activated using low thermal energy or low plasma energy to prevent damage from reactive radicals and high energy ions, for example. According to embodiments using a combination of process operations in a manner the same as or similar to known atomic layer deposition (ALD) techniques and may be referred to as "atomic layer deposition" process herein. As is known, an ALD process may entail self-limiting deposition where a given monolayer is formed in two or more separate operations, such as the separate deposition of two or more sub-monolayers. The term "sub-monolayer" may refer to a continuous layer, where the sub-monolayer is a component of a fully formed monolayer of a product material to be formed by reaction with additional species. The deposition takes place in a cyclic fashion where a given monolayer is formed by a self-limiting reaction of the (at least) two sub-monolayers. In particular embodiments of the disclosure, variants of this process include a plasma enhanced ALD (PEALD) where a conformal submonolayer may be formed by chemisorption from a given precursor(s), followed by exposure to a low energy plasma containing species such as $N_2$ or $H_2$, for example. The reaction with the low energy plasma species may complete formation of a given monolayer of the interface layer to protect the patterned device stack. A given monolayer of interface layer material is thus formed in a given deposition cycle where the deposition cycle corresponds to at least two exposures. As detailed below an interface layer may be formed from as few as two or three monolayers, or may be formed from several monolayers up to tens of monolayers. The interface layer may be formed in a manner not substantially altering process flow for forming a magnetic device, while providing improved stability and properties of magnetic devices.

Figure 1B:
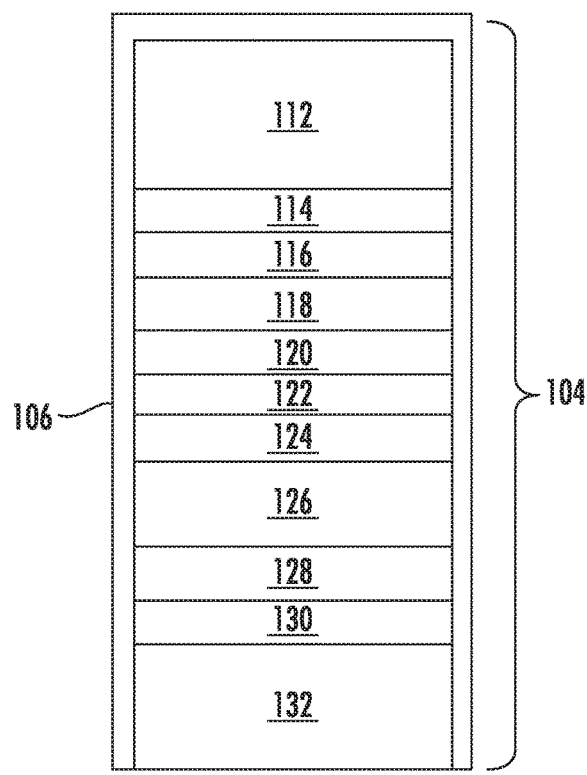

FIGS. 1A and 1B depict aspects of a device 100 according to embodiments of the disclosure. The device 100 may in particular be a magnetic device such as an MRAM or MTJ device. The device 100 may include a substrate 102, where the substrate may represent any number of layers or components. A device stack 104 may be disposed on the substrate 102. The device stack 104 may include multiple layers as further described with respect to FIG. 1B. The device stack 104 may be formed by patterning a layer stack comprising a plurality of blanket layers, such as metal contact layers, magnetic layers, insulator layers, and so forth. The device stack 104 may be patterned into a convenient shape within the X-Y plane of the Cartesian coordinate system shown, such as a rectangle, square, circle, or other shape, so as to form a memory cell having a pillar type structure or other convenient shape. The substrate 102 may support an array of memory cells having the same structure as the device stack 104 to form a memory device as known in the art. In various embodiments, the device stack may have a height along the Z-axis of less than 200 nm, such as 50 nm or 100 nm. Similarly the device stack may have a width along the X-axis or Y-axis of 20 nm, 50 nm, or 100 nm. The embodiments are not limited in this context.

As further shown in FIG. 1A, the device 100 may include a number of layers disposed around the device stack 104, where the different layers may be formed from electrical insulator materials, or just "insulator materials." As shown in FIG. 1A, an interface layer 106 may be disposed on the device stack 104, including on sidewall portions 107. The interface layer 106 may be disposed in a conformal manner over the device stack 104 as shown. The interface layer 106 may be formed from a first insulator material, such as Si—C—N, where Si—C—N generally may have the structure of a network of Si, C, and N atoms bonded to one another, where the composition of the interface layer 106 may not be fixed to a particular ratio of Si:C:N. In other embodiments, the interface layer may be formed of silicon nitride or of aluminum oxide. The embodiments are not limited in this context. According to some embodiments the thickness of the interface layer 106 may range between 1 nanometer (nm) and 10 nanometers, and in particular embodiments between 1 nanometer and 3 nanometers. The interface layer 106 may serve to improve the properties of the device 100 as discussed further below.

In addition, an encapsulation layer 108 may be disposed on the interface layer 106 as shown. In various embodiments, the encapsulation layer 108 may be formed from a second insulator material, including known materials used to encapsulate a magnetic memory device, such as silicon nitride. According to embodiments of the disclosure the thickness of the encapsulation layer 108 may range between 10 nanometers and 20 nanometers. The embodiments are not limited in this context. The encapsulation layer 108 may provide protection of the device stack 104, such as acting as a diffusion barrier in preventing oxidation of individual layers of device stack 104, discussed below with respect to FIG. 1B. As also shown in FIG. 1A, the device 100 may include an interlevel dielectric 110 disposed on the encapsulation layer 108, where the interlevel dielectric 110 (ILD) comprises a third insulator material, such as silicon oxide or other known ILD material.

Notably, the device 100 shown in FIG. 1A may be arranged at an intermediate stage of device processing, where further processing is to take place to form a finished device. Such further stages of processing may include planarization and opening of contact regions to form electrical contact to the top of the device stack 104, as well as metallization to electrically connect the device stack 104 to other components.

Turning now to FIG. 1B there is shown a detailed structure of one variant of the device stack 104. In this example, the device stack 104 may be used for MRAM applications and may include multiple metal layers including a plurality of magnetic layers as generally known in the art. Examples of metals used in a device stack 104 may include Cu, Co, Fe, Ti, Ta, Pt, Ru, and other metals. In particular, for the purposes of illustration, the device stack 104 may include a layer 112 formed from a magnetic superlattice; a layer 114 formed from a material such as Ti, Ta, or similar material; a layer 116 formed from a magnetic alloy; a layer 118 formed from an insulator such as MgO; a layer 120, formed from a magnetic alloy; a layer 122 formed from a material similar or the same as layer 114; a layer 124 formed from a magnetic alloy; a layer 126 formed from an insulator layer such as MgO; a layer 128 formed from a magnetic alloy; a layer 130 formed from a material similar to or the same as layer 122; and a layer 132 formed from a magnetic superlattice. The embodiments are not limited in this context.

Such a device stack may be effective as a magnetic tunnel junction device serving as a memory device when addressable by an outside signal.

In order to serve as a memory device preservation of the magnetic properties of the device stack 104 is useful after processing the device stack 104 to form a completed device. The structure of device 100 may aid in preservation of the magnetic properties of the device stack 104 by the protecting magnetic layers in particular of the device stack 104 from unwanted alteration, including degradation caused by species present during formation of the encapsulation layer 108. In particular, by virtue of the presence of the interface layer 106, directly adjacent portions of magnetic layers of the device stack 104, these magnetic layers may be protected from attack by species used to form the encapsulation layer 108. In turn, and as described below, the interface layer 106 may be formed in a manner resulting in little or no degradation of magnetic properties of the device stack 104 during the growth of interface layer 106.

In accordance with various embodiments of the disclosure, FIGS. 2A-2H illustrate various operations involved in a technique for forming a magnetic device. In the growth sequence shown, formation of an interface layer and an encapsulation layer is depicted at an atomistic or molecular level. The growth sequence is shown with respect to a substrate 200. While depicted as a planar structure, the substrate 200 may represent the sidewalls or tops of a device stack, for example, including surfaces of magnetic layers of a device stack exposed to ambient (see sidewall portions 107, for example). In accordance with embodiments of the disclosure, formation of an interface layer 106 is shown in the FIGS. 2A-2D. In various embodiments, the sequence of operations shown in FIGS. 2A-2D may be accomplished using an ALD process or PEALD process.

Turning now to FIG. 2A there is shown an initial instance where a first precursor 202 is provided to the substrate 200. In various embodiments the first precursor may be provided as a pulse of material in the gas phase within a deposition chamber, where a sufficient amount of material of first precursor 202 is provided to form a sub-monolayer covering the substrate 200.

The formation of the sub-monolayer may take place via chemisorption and may form a conformal layer in cases where the substrate 200 represents a pillar or other three dimensional structure. At FIG. 2B there is shown an instance when a sub-monolayer of first precursor 202 is already formed on the substrate 200 and a purge is conducted to evacuate the deposition chamber of excess amounts of first precursor 202. At FIG. 2C there is shown a subsequent instance where a second precursor 204 is provided to the substrate 200 when coated with the sub-monolayer of the first precursor 202, partially forming a reaction product. At FIG. 2D, there is shown a fully formed monolayer, shown as monolayer 206, of the interface layer 106 when sufficient amount of second precursor 204 reacts with the entire sub-monolayer of first precursor 202. Subsequently the reaction chamber used for forming the monolayer 206 may be purged, completing a cycle of deposition of a monolayer of interface layer 106.

This process may be repeated by returning to the operation of FIG. 2A and cycling through the sequence shown in FIGS. 2A-2D for a targeted number of cycles to form a target thickness of the interface layer 106. As noted, in accordance with different embodiments of the disclosure, the process of FIGS. 2A-2D may be an atomic layer deposition process where the process of depositing the insulator material of interface layer 106 takes place while not exposing the device stack 104 to a plasma. In other embodiments, the process of FIGS. 2A-2D may be a plasma enhanced atomic layer deposition process where species from at least one sub-monolayer are derived from a plasma. In the case of PEALD the second precursor 204 may be an ionized or reactive gas species reacting with the first precursor 202, such as a reactive species derived from a nitrogen plasma or hydrogen plasma. The embodiments are not limited in this context.

Turning now to FIG. 2E there is shown the interface layer 106 after deposition on the substrate 200. According to various embodiments, the interface layer 106 may comprise a thickness of one nanometer to ten nanometers as noted. In this example the interface layer 106 may be formed from several layers of monolayer 206. This thickness may be sufficient to protect a device stack represented by substrate 200 from degradation when a subsequent encapsulation layer is deposited. At the same time this thickness may be sufficiently thin so as not to substantially affect other processes for forming a final device or entail excessive time for forming of interface layer 106.

In addition, because the interface layer 106 is formed using an ALD process or a PEALD process, the substrate 200 may experience little or no degradation during growth of the interface layer. In particular, where the substrate 200 represents magnetic layer(s) of a device stack, the magnetic layers may remain intact while not experiencing the degradation often found when encapsulating layers are directly formed on a magnetic device stack using PECVD, for example. In particular embodiments, the reaction chemistry used for the processes of FIGS. 2A-2D may be chosen to prevent byproducts such as halogen-containing radicals or amino groups or reactive oxygen radicals. Moreover, the deposition of the interface layer 106 may take place at relatively low temperature wherein depositing the interface layer 106 takes place at a temperature of 150° C. to 400° C., and more particularly between 150° C. to 250° C. in some instances. The combination of relatively low temperature and a less harsh reactive environment may ensure that device properties of a device stack remain intact during formation of the interface layer 106 as well as during subsequent processing. In particular, the present inventors have found that performing a PEALD process at 200° C. to form a Si—C—N layer on a magnetic device stack results in much better device properties as compared to forming a SiN layer by conventional PECVD processing at 350° C. directly encapsulating the magnetic device stack. More particularly, the device stack coated with PECVD SiN was found to exhibit high electrical resistance, low tunnel magnetoresistance (TMR), and low coercivity as compared to the device stack coated with a PEALD Si—C—N layer.

Turing now to FIGS. 2F and 2G, there are shown subsequent operations for forming the encapsulation layer 108. In the particular example of FIG. 2F a Si—N layer may be formed using a PECVD process, such as a plasma containing $SiH_4$ and $NH_3$. This plasma may generate molecular species containing silicon and nitrogen and condensing on the layer 106 as shown in FIG. 2F. Turning to FIG. 2G there is shown a subsequent instance where a network of Si—N and H species form a continuous layer on the layer 106. In some examples the deposition processes shown in FIGS. 2F and 2G may take place at a conventional temperature range for PECVD of Si—N, such as 300° C. to 400° C. The embodiments are not limited in this context. In FIG. 2H there is shown the result of the processes of FIGS. 2A-2G where substrate 200 is coated by an interface layer 106 and an encapsulation layer 108. The combination of encapsulation layer 108 and interface layer 106 may provide protection for the substrate 200 from subsequent processing involved in forming a final device, such as an MTJ device. Additionally, because the interface layer 106 is in place and itself encapsulating the substrate 200, the substrate 200 is protected from possible attack by species used in the formation of the encapsulation layer 108. In cases where the substrate 200 represents a magnetic device stack degradation of magnetic and electrical properties accompanying direct PECVD of SiN may accordingly be avoided.

In particular examples of PEALD where the interface layer is an Si—N material, in the operation shown in FIG. 2A the substrate 200 may be exposed to a precursor comprising silicon and nitrogen to provide a precursor silicon and nitrogen at the substrate surface. The operation of FIG. 2C may involve exposing the substrate surface of substrate 200 to an ionized reducing agent, wherein the substrate has a temperature of 23° C. to about 400° C.

In some examples, an interface layer may be formed by providing silyl-terminated molecules or alkylaminosilanes molecules. In additional embodiments, the precursor comprising silicon and nitrogen may include $N(SiH_3)_3$, $(SiH_3)_2NH$, aminosilane, or bis-diethylamine silane. In one or more embodiments, the substrate temperature may range from about 200° C. to about 400° C. In some embodiments, the ionized reducing agent comprises nitrogen, hydrogen, an alkyl amine, hydrazine or a substituted hydrazine. In one or more embodiments, the alkyl amine comprises dimethyl amine. In some embodiments, the substituted hydrazine comprises $CH_3N_2H$. Examples of other compounds include, but are not limited to trisilylamine (TSA) and bis-diethylamine silane (BDEAS). Other examples of silicon precursors also containing nitrogen include silazane-based precursors. Such compounds have the formula:

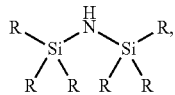

wherein a given R is independently hydrogen or C1-C6 alkyl. In some embodiments, at least one of the R groups is methyl. In further embodiments, the silicon precursor is silazane. In other embodiments, the silicon precursor has formula $(SiH_3)_2NH$. In particular embodiments where the R group contains carbon, the resulting film may contain carbon as well and may form a Si—C—N material.

In a PEALD process for forming the interface layer 106 from the Si—N material, once the sub-monolayer of first precursor 202 is deposited at the substrate surface, the substrate surface of substrate 200 may then be exposed to a reducing agent. Notably, ionized reducing gases generated by a plasma may greatly increase the effectiveness of the reaction due to higher energy levels. In some embodiments, the gases may be ionized inside a process chamber, or outside (i.e., remotely) then flown into the processing chamber containing the substrate 200. Exemplary reducing agents include, but are not limited to $H_2$, and $N_2$. Reducing agents containing nitrogen may act as nitrogen precursors for the film. Hydrogen may be a suitable reducing agent where the silicon precursor also contains nitrogen. Reactions of the film with these gases result in the removal of halogen atoms cross-linking to form the Si—N—Si network. In the various embodiments noted above, during an ALD process, while nitrogen-containing species may be generated, the production of reactive byproduct species containing amino groups may be avoided. Accordingly, damage of magnetic properties of a device stack by reactive byproduct species containing amino groups may be avoided. The reducing gases may then be pumped or purged away.

In other embodiments where the interface layer 106 is formed from aluminum oxide, a conventional (non-plasma) ALD process may be employed where the first precursor 202 may be trimethylaluminum, and the second precursor 204 is $O_2$. In other embodiments, an appropriate known precursor(s) containing hafnium as first precursor 202 may be used to form an $HfO_2$ (hafnium oxide) material as interface layer 106. In these additional embodiments, damaging reactive products including amino or halogen species may also be avoided by appropriate selection of precursors. Moreover, in these additional embodiments, the thickness of interface layer 106 may be relatively small, such as 3 nm or less, before an encapsulation layer such as silicon nitride is subsequently deposited. The thickness of such an interface layer 106 may be designed to be sufficient to protect the substrate 200 such as a magnetic device stack from damage during formation of the encapsulation layer 108, while being sufficiently thin to provide a rapid ALD process and not substantially alter the final device structure including encapsulation layer 108 and interlevel dielectric 110. The embodiments are not limited in this context.

Figure 3:
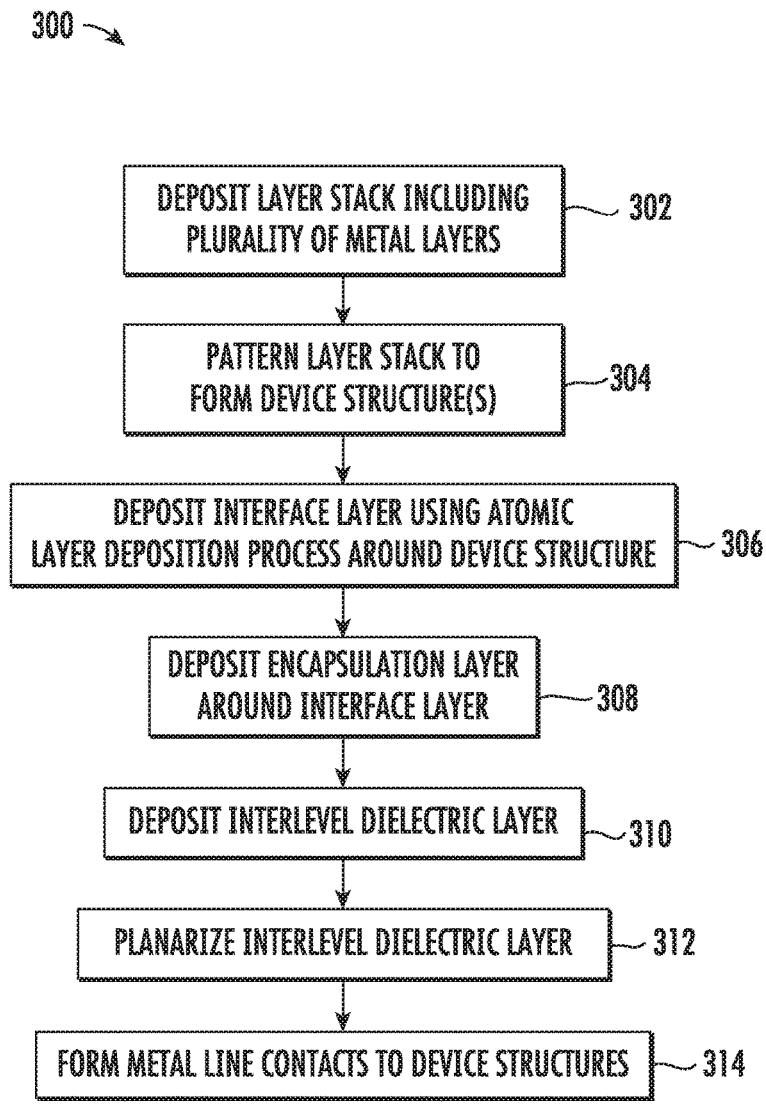
FIG. 3 depicts an exemplary process flow.

FIG. 3 depicts an exemplary process flow 300. At block 302, a layer stack is deposited. The layer stack may include a plurality of metal layers including a plurality of magnetic layers, as well as insulator layers. At block 304 the layer stack is patterned, such as by known lithographic and etch techniques to form a patterned device structure. At block 306 an interface layer is deposited using an atomic layer deposition process to form the interface layer around the device structure. The atomic layer deposition process may be a known process not employing a plasma or may be a PEALD process. The ALD process may be designed so as not to degrade the magnetic properties of the patterned device structure. At block 308 an encapsulation layer is deposited around the interface layer. The encapsulation layer may be deposited by known techniques such as PECVD. At block 310 an interlevel dielectric is deposited, where the interlevel dielectric may coat the encapsulation layer. At block 312 the interlevel dielectric is planarized. At block 314 metal line contacts are formed to the device structure.

The present embodiments provide various advantages over conventional processing a magnetic device structure. One advantage lies in the ability to protect the magnetic device structure by forming an interface layer without subjecting the exposed magnetic device structure to harsh processing conditions, including gaseous mixture containing ammonia or halogen species. Another advantage is the ability to protect the magnetic device structure by still providing a robust encapsulation layer, where the process of depositing the robust encapsulation layer does not harm the magnetic device structure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a device stack, the device stack comprising sidewall portions and extending above a substrate base, the device stack further including a plurality of metal layers;
   depositing an interface layer conformally over the device stack using an atomic layer deposition process, the interface layer comprising a first nitride material;
   depositing an encapsulation layer on the interface layer, the encapsulation layer comprising a second nitride material; and
   depositing an interlevel dielectric disposed on the encapsulation layer, the interlevel dielectric comprising a third insulator material, wherein the depositing the interface layer comprises selecting a reaction chemistry that prevents formation of halogen-containing radicals, amino groups or reactive oxygen radicals.

2. The method of claim 1, the first insulator material comprising silicon nitride or Si—C—N.

3. The method of claim 1, the second insulator material comprising silicon nitride.

4. The method of claim 1, the interface layer having a thickness of one to ten nanometers.

5. The method of claim 1, the depositing the interface layer comprising using a plasma enhanced atomic layer deposition process.

6. The method of claim 1, the depositing the encapsulation layer comprising growing the encapsulation layer using a plasma enhanced chemical vapor deposition process.

7. The method of claim 1, wherein the device stack comprises a magnetic tunnel junction device having a plurality of magnetic layers and at least one insulator layer.

8. The method of claim 5, wherein the depositing the interface layer takes place at a temperature of 150° C. to 250° C.

9. The method of claim 1, wherein the depositing the interface layer takes place at a temperature of 150° C. to 400° C.

10. The method of claim 1, wherein the depositing the interface layer comprises providing silyl-terminated molecules or alkylaminosilanes molecules.

11. A method of forming a magnetic device, comprising:
    providing a device stack, the device stack extending above a substrate base and comprising sidewall portions, the device stack further including a plurality of magnetic layers;
    depositing an interface layer conformally over the device stack using an atomic layer deposition process, the interface layer comprising a nitride material having a thickness of one nanometer to three nanometers;
    depositing an encapsulation layer on the interface layer, the encapsulation layer comprising silicon nitride; and
    depositing an interlevel dielectric disposed on the encapsulation layer, the interlevel dielectric comprising an insulating material, wherein the depositing the interface layer comprises selecting a reaction chemistry that prevents formation of halogen-containing radicals, amino groups or reactive oxygen radicals.

12. The method of claim 11, wherein the insulator material of the interface layer is a S—C—N mixture.

13. The method of claim 11, wherein the depositing the interface layer comprises depositing the insulator material while not exposing the device stack to a plasma.

* * * * *